(12) United States Patent
Bratkovski et al.

(10) Patent No.: US 8,207,593 B2
(45) Date of Patent: Jun. 26, 2012

(54) MEMRISTOR HAVING A NANOSTRUCTURE IN THE SWITCHING MATERIAL

(75) Inventors: Alexandre M. Bratkovski, Mountain View, CA (US); Qiangfei Xia, Palo Alto, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 419 days.

(21) Appl. No.: 12/510,589

(22) Filed: Jul. 28, 2009

(65) Prior Publication Data

US 2011/0024716 A1 Feb. 3, 2011

(51) Int. Cl.
 *H01L 29/00* (2006.01)
(52) U.S. Cl. ............. 257/537; 257/E42.003; 977/773; 438/382
(58) Field of Classification Search ............... 257/2, 4, 257/5, 314, 528, 536, 537, E45.003, E21.003, 257/E21.662, E21.004; 438/104, 381, 382; 977/700, 708, 720, 721, 763, 773, 810, 811
See application file for complete search history.

(56) References Cited

U.S. PATENT DOCUMENTS

| | | | | |
|---|---|---|---|---|
| RE37,259 | E * | 7/2001 | Ovshinsky | 365/163 |
| 6,746,892 | B2 * | 6/2004 | Lee et al. | 438/95 |
| 7,361,924 | B2 * | 4/2008 | Breuil et al. | 257/4 |
| 7,381,982 | B2 * | 6/2008 | Hsueh | 257/4 |
| 7,612,358 | B2 * | 11/2009 | Joo et al. | 257/2 |
| 7,618,708 | B2 * | 11/2009 | Mizuno et al. | 428/403 |
| 7,738,280 | B2 * | 6/2010 | Yoshii et al. | 365/148 |
| 7,820,064 | B2 * | 10/2010 | Jin | 216/41 |
| 7,897,955 | B2 * | 3/2011 | Jin et al. | 257/2 |
| 7,998,804 | B2 * | 8/2011 | Park et al. | 438/211 |
| 8,029,722 | B2 * | 10/2011 | Mattila et al. | 264/450 |
| 2005/0079551 | A1 * | 4/2005 | Mizuno et al. | 435/7.1 |
| 2006/0121391 | A1 * | 6/2006 | Khang et al. | 430/270.13 |
| 2006/0160304 | A1 * | 7/2006 | Hsu et al. | 438/257 |
| 2006/0268598 | A1 * | 11/2006 | Snider | 365/151 |
| 2006/0291268 | A1 * | 12/2006 | Happ et al. | 365/103 |
| 2007/0012956 | A1 * | 1/2007 | Gutsche et al. | 257/246 |
| 2007/0045704 | A1 * | 3/2007 | Ufert | 257/314 |
| 2007/0090444 | A1 * | 4/2007 | Park et al. | 257/314 |
| 2007/0167008 | A1 * | 7/2007 | Hsu et al. | 438/681 |
| 2008/0090337 | A1 * | 4/2008 | Williams | 438/133 |
| 2008/0099820 | A1 * | 5/2008 | Coppard et al. | 257/316 |
| 2008/0206931 | A1 * | 8/2008 | Breuil et al. | 438/128 |
| 2008/0268288 | A1 * | 10/2008 | Jin | 428/800 |
| 2008/0308783 | A1 * | 12/2008 | Ahn et al. | 257/2 |
| 2009/0081431 | A1 * | 3/2009 | Mattila et al. | 428/213 |

(Continued)

OTHER PUBLICATIONS

Yoo et al., "Site-Specific Magnetic Assembly of Nanowires for Sensor Arrays Fabrication", IEEE Transactions on Nanotechnology, vol. 7 Issue 3 pp. 251-255.

*Primary Examiner* — Laura M Menz
*Assistant Examiner* — Joseph C Nicely

(57) ABSTRACT

A memristor includes a first electrode having a first surface, at least one electrically conductive nanostructure provided on the first surface, in which the at least one electrically conductive nanostructure is relatively smaller than a width of the first electrode, a switching material positioned upon said first surface, in which the switching material covers the at least one electrically conductive nanostructure, and a second electrode positioned upon the switching material substantially in line with the at least one electrically conductive nanostructure, in which an active region in the switching material is formed substantially between the at least one electrically conductive nanostructure and the first electrode.

17 Claims, 5 Drawing Sheets

U.S. PATENT DOCUMENTS

| | | |
|---|---|---|
| 2009/0236079 A1* | 9/2009 | Khodadadi ............... 165/104.21 |
| 2010/0127232 A1* | 5/2010 | Boeve et al. ....................... 257/2 |
| 2011/0221027 A1* | 9/2011 | Quitoriano et al. ............ 257/485 |
| 2011/0227022 A1* | 9/2011 | Cho ................................. 257/3 |
| 2011/0227030 A1* | 9/2011 | Pickett et al. ..................... 257/4 |
| 2011/0228593 A1* | 9/2011 | Strukov ........................ 365/148 |
| 2011/0261608 A1* | 10/2011 | Borghetti et al. ............. 365/148 |
| 2011/0266510 A1* | 11/2011 | Quitoriano et al. ................ 257/2 |
| 2011/0266513 A1* | 11/2011 | Williams et al. .................. 257/4 |

* cited by examiner

MEMRISTOR HAVING A NANOSTRUCTURE IN THE SWITCHING MATERIAL

CROSS-REFERENCE TO RELATED APPLICATIONS

The present application has the same Assignee and shares some common subject matter with U.S. Patent Application Publication No. 20080090337, filed on Oct. 3, 2006, by R. Stanley Williams and PCT Patent Application No. PCT/US09/30827, entitled "Memristor Having a Triangular Shaped Electrode", filed on Jan. 13, 2009, and U.S. patent application Ser. No. TBD, entitled "Memristor with a Non-Planar Substrate", filed on even date herewith. The disclosures of which are hereby incorporated by reference in their entireties.

BACKGROUND

Solid state memristive devices rely on the drift of mobile charge dopants upon the application of an electrical field, as discussed in the Patent Publication 20080090337. These types of devices have been found to have promising properties in the fields of both digital and analog non-volatile electronic logic. To illustrate the increase potential of analog non-volatile electronic logic, synaptic computing has emerged as a potential technology that is enabled by the relatively small size, low cost, and low power consumption provided by solid state memristive devices.

Researchers have designed nano-scale reversible switches with an ON-to-OFF conductance ratio up to $10^4$. Crossbar circuitry is often constructed using these types of switches. A useful configuration of this crossbar circuitry is a latch, which is an important component for constructing logic circuits and communicating between logic and memory. Researchers have described logic families entirely constructed from crossbar arrays of switches, as well as hybrid structures using switches and transistors. The devices that are presently fabricated have room for improvement particularly in terms of cyclability.

BRIEF DESCRIPTION OF THE DRAWINGS

Embodiments are illustrated by way of example and not limited in the following figure(s), in which like numerals indicate like elements, in which.

DETAILED DESCRIPTION

Figure 1A:
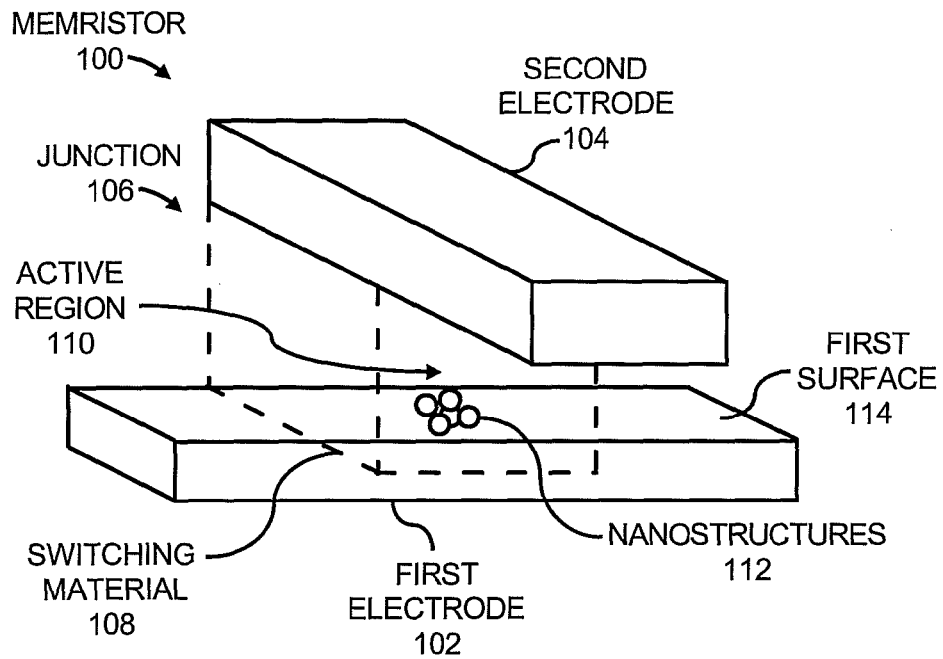
FIG. 1A illustrates a perspective view of a memristor, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein is a memristor formed of a pair of spaced apart electrodes with a switching material positioned between the electrodes. In addition, at least one electrically conductive nanostructure is provided in the switching material, which improves the electrical field lines between the electrodes and thus the performance of the memristor. More particularly, the at least one electrically conductive nanostructure disclosed herein enables the drift of mobile charge dopants to be more focalized as compared with conventional memristive devices, which results in improved performance.

As discussed in greater detail herein below, the at least one electrically conductive nanostructure may comprise one or more nano-particles, which are regular or irregular-shaped elements having nano-scale sizes (typically smaller than 50 nanometers). In addition or alternatively, the at least one electrically conductive nanostructure may comprise one or more nanowires having nano-scale sizes (typically smaller than 50 nanometers).

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

A memristor is a two-terminal device in which the magnetic flux between the terminals is a function of the amount of electric charge that has passed through the device.

A crossbar is an array of switches, here memristors, that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

With reference first to FIG. 1A, there is shown a perspective view of a memristor 100, according to an embodiment. It should be understood that the memristor 100 depicted in FIG. 1A may include additional components and that some of the components described herein may be removed and/or modified without departing from a scope of the memristor 100. It should also be understood that the components depicted in FIG. 1A are not drawn to scale and thus, the components may have different relative sizes with respect to each other than as shown therein.

Generally speaking, the memristor 100 depicted in FIG. 1A may be built at the micro- or nano-scale and used as a component in a wide variety of electronic circuits. For instance, the memristor 100 may be used as the basis for memories, switches, and logic circuits and functions. When used as a basis for memories, the memristor 100 may be used to store a bit of information, 1 or 0. When used as a switch, the memristor 100 may either be a closed or open switch in a cross-point memory. When used as a logic circuit, the memristor 100 may be employed as bits in a logic circuit that resembles a Field Programmable Gate Array, or as the basis for a wired-logic Programmable Logic Array. The memristor 100 disclosed herein is also configured to find uses in a wide variety of other applications.

As depicted in FIG. 1A, the memristor 100 includes a first electrode 102 positioned below a second electrode 104. In addition, the first electrode 102 is in a crossed arrangement with respect to the second electrode 104. One or both of the first electrode 102 and the second electrode 104 may be formed of metal or semiconductor materials. By way of particular example, both of the first electrode 102 and the second electrode 104 are formed of, for instance, platinum, gold, titanium, silver, or the like.

A switch junction 106 is depicted as connecting the first electrode 102 to the second electrode 104. The switch junction 106 is composed of a switching material 108, which may include, for instance, titanium dioxide ($TiO_2$) or other oxide species, such as nickel oxide or zinc oxide, etc. In one regard, the switching material 108 is configured to have a conductive channel (active region 110) formed into the switching material 108 by a localized field-driven atomic modification, as discussed in greater detail herein below. In another embodiment, the switching material 108 is formed of any suitable material that is formed of molecules having a switchable segment or moiety that is relatively energetically stable in two different states.

Although the switching material 108 has been depicted as having a similar size as the first and second electrodes 102, 104, it should be understand that the switching material 108 may extend substantially outside of the junction 106 and may extend to junctions between other first and second electrodes (not shown).

A plurality of electrically conductive nanostructures 112 are also depicted as being positioned within the switching material 108. More particularly, the nanostructures 112 are depicted as being positioned in contact with a first surface 114 of the first electrode 102, in which the first surface 114 faces the second electrode 104. The nanostructures 112 may be formed of one or more colloidal metals, such as, gold, titanium, platinum, silver, or the like. In addition or alternatively, the nanostructures 112 may be formed of doped silicon. The nanostructures 112 may also have sizes that range between several nanometers to several tens of nanometers. By way of particular example, the nanostructures 112 may each have a width of between about 1-10 nanometers. As another example, the nanostructures 112 may occupy a space having a total width of between about 1-50 nanometers.

According to an embodiment, the nanostructures 112 may comprise substantially regularly shaped elements and may thus have substantially the same sizes and shapes with respect to each other. According to another embodiment, the nanostructures 112 may comprise irregularly shaped elements and may thus have differing shapes and sizes with respect to each other. In either of these embodiments, the nanostructures 112 may be formed prior to placement on the first surface 114 or the nanostructures 112 may be formed, for instance, through growth from a seed material, on the first surface 114.

Figure 1B:
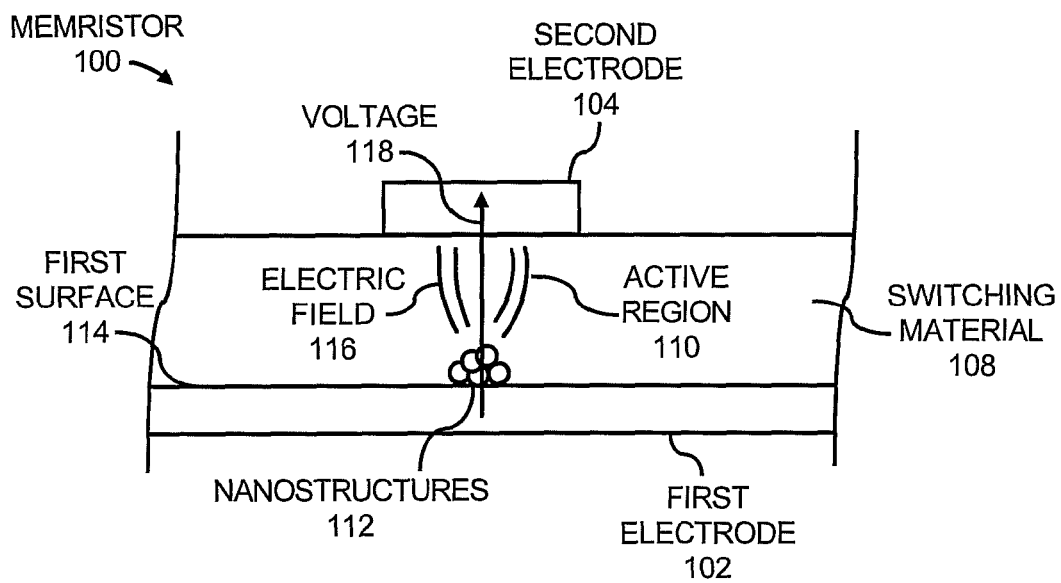
FIGS. 1B-1F, respectively, illustrate cross-sectional front views of the memristor depicted in FIG. 1A, according to embodiments of the invention.
Figure 1C:
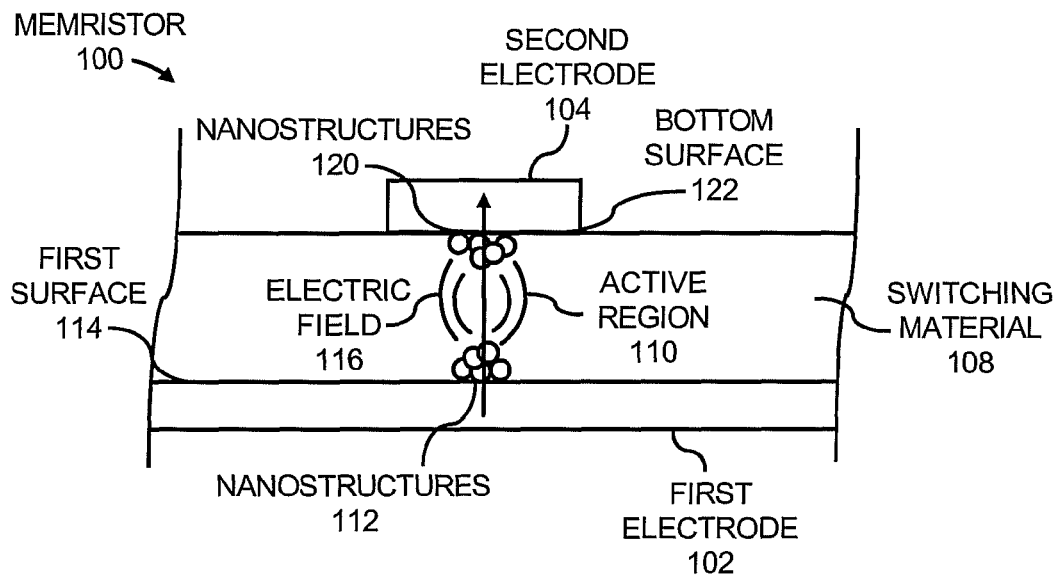
Figure 1D:
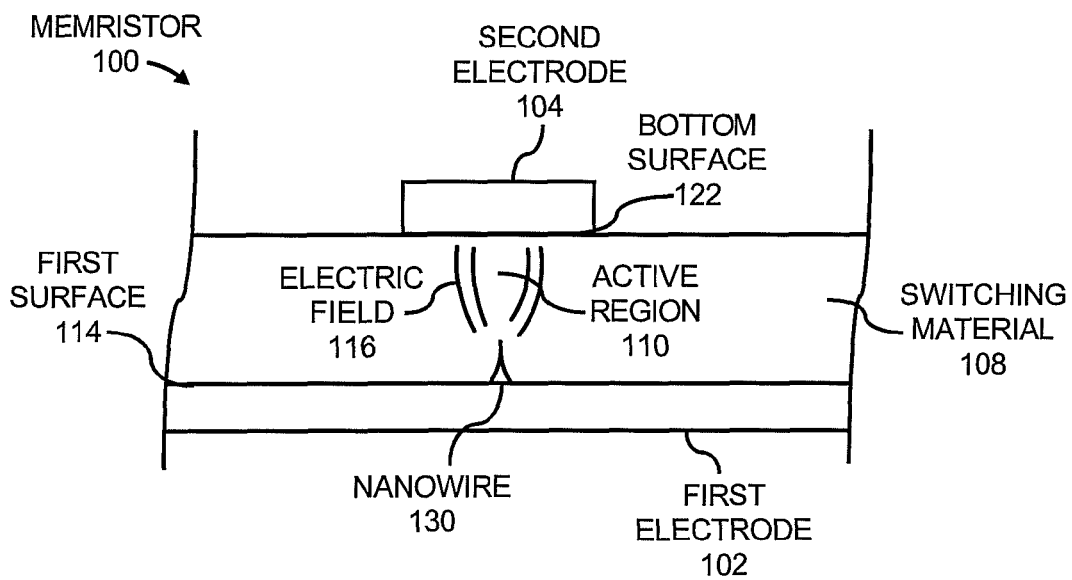
Figure 1E:
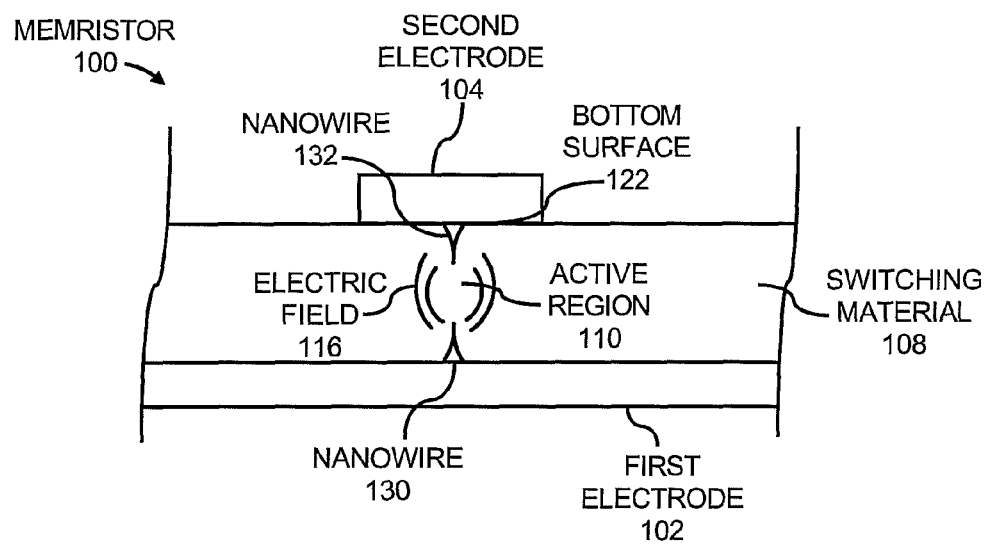
Figure 1F:
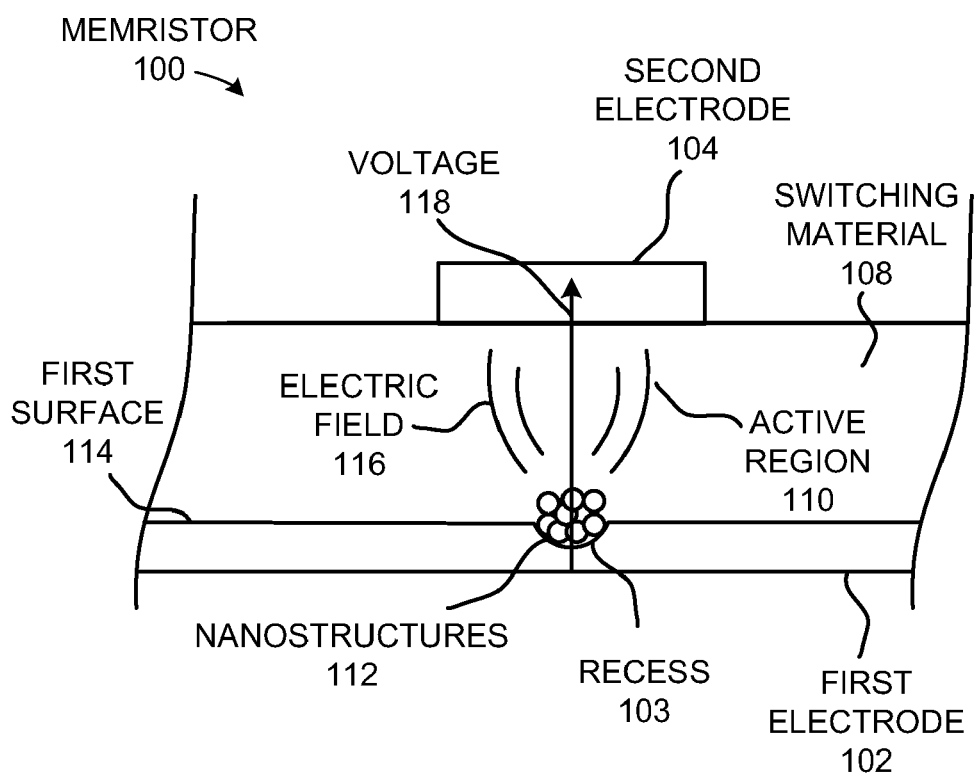

Although not shown in FIG. 1A, but as shown in FIG. 1F, the first surface 114 may include a recess 103 into which the nanostructures 112 may be provided. The recess 103 may be formed in the first surface 114 to generally define the location on the first surface 114 where the junction 106 is to be formed with the second electrode 104. In addition, the recess 103 may be sufficiently shallow to enable the nanostructures 112, which are depicted as being formed into a cluster, to extend above the height of the recess 103. In any regard, a recess 103 may be formed through any suitable conventional technique on the first surface 114, such as, through a nano-imprint operation.

With reference now to FIG. 1B, there is shown a cross-sectional front view of the memristor 100 depicted in FIG. 1A, according to an embodiment. As shown in FIG. 1B, an electric field 116 at the active region 110 of the switching material 108 is created when a voltage 118 is applied across the first electrode 102, the nanostructures 112 and the second electrode 104, as denoted by an arrow. Although the voltage 118 is depicted as originating from the first electrode 102, it should be understood that the voltage 118 may instead originate from the second electrode 104 without departing from a scope of the memristor 100.

Field lines of the electric field 116 illustrate the intensity of the field between the first electrode 102 and the second electrode 104 when a voltage 118 is applied across the electrodes. Initially the entire switching material 108 is nonconductive. As such, a forming process is required to form a conductive channel in the switching material 108 between the first electrode 102 and the second electrode 104. The forming process includes applying a sufficiently high (threshold) voltage across the first electrode 102 and the second electrode 104 for a sufficient length of time to cause the conductive channel (active region 110) in the switching material 108 to form. The threshold voltage and the length of time required for the forming process may depend upon the type of material used for the switching material 108, the first electrode 102 and the second electrode 104.

The conductive channel formed from the forming process is referred to herein as the active region 110 of the memristor 100. In addition, the conductivity of the active region 110 may be modulated by applying different biases across the first electrode 102 and the second electrode 104. Thus, the memristor 100 may be reconfigurable based upon the bias applied across the first electrode 102 and the second electrode 104. In other instances, the memristor 100 may include a switching material 108 that is singly configurable.

As shown in FIG. 1B, the nanostructures 112 generally localize the formation of the conductive channel (active region 110) in the switching material 108 during the forming step. More particularly, the relatively shorter distance between the top of the nanostructures 112 and the bottom of the second electrode 104 as compared with the first surface 114 and the bottom of the second electrode 104 creates a local field enhancement effect above the nanostructures 112.

As such, the electric field 116 at the tops of the nanostructures 112 is much higher than if the same bias was applied across the flat portions of the first surface 114. In addition to concentrating the electric field 116 during the electroforming step, the nanostructures 112 will also localize the electrochemical reaction that occurs between the first electrode 102 and the switching material 108 and will also localize the mechanical stress during deposition of the switching material 108, all of which may assist in localizing the electroforming of conductive channel in the switching material 108 at the desired location in the memristor 100.

In a conventional memristor having a relatively flat profile, the conductive channel formed during a forming step may occur at any point along the junction of crossed electrodes. The location of an active region prior to the forming process in a conventional memristor is thus difficult to predict and thus the conventional memristors require that the memristors be spaced with a sufficient margin of error to prevent cross talk between the memristors. In the memristor 100, the conduction channel localization afforded by the nanostructures 112 improves the predictability of the spatial location of the active region 110. The memristor 100 disclosed herein is thus able to be spaced more closely together with other memristors 100 with reduced risk of cross talk as compared with the conventional memristors.

Turning now to FIG. 1C, there is shown a cross-sectional side view of the memristor 100 depicted in FIG. 1A, according to another example. As shown, the memristor 100 depicted in FIG. 1C includes all of the features of the memristor 100 depicted in FIG. 1B. In addition, the memristor 100 depicted in FIG. 1C also includes additional nanostructures 120 provided in contact with a bottom surface 122 of the second electrode 104. As with the nanostructures 112, the nanostructures 120 are in electrical contact with the second electrode 104 and may comprise any of the materials discussed above with respect to the nanostructures 112.

According to an embodiment, the nanostructures 120 may be placed or grown on the switching material 108 prior to placement or growth of the second electrode 104 on the switching material 108. According to another embodiment, the nanostructures 120 may be attached to the bottom surface 122 of the second electrode 104 after formation of the switching material 108 and prior to placement of the second electrode 104 on the switching material 108.

As shown in FIG. 1C, the field lines of the electric field 116 appear to be more focalized as compared with the field lines of the electric field 116 shown in the memristor 100 depicted in FIG. 1B. Thus, for instance, the nanostructures 112 and 120 generally localize the formation of the conductive channel (active region 110) in the switching material 108 during the forming step. More particularly, the relatively shorter distance between the top of the nanostructures 112 and the bottoms of the nanostructures 120 as compared with the first surface 114 and the bottom of the second electrode 104 creates a local field enhancement effect above the nanostructures 112 and below the nanostructures 120.

As such, the electric field 116 at the tops of the nanostructures 112 and the bottoms of the nanostructures 120 is much higher than if the same bias was applied across the flat portions of the first surface 114 and the bottom surface 122. In addition to concentrating the electric field 116 during the electroforming step, the nanostructures 112 and 120 will also localize the electrochemical reaction that occurs between the first electrode 102, the second electrode 104 and the switching material 108 and will also localize the mechanical stress during deposition of the switching material 108, all of which may assist in localizing the electroforming of the conductive channel in the switching material 108 at the desired location in the memristor 100.

Turning now to FIG. 1D, there is shown a cross-sectional side view of the memristor 100 depicted in FIG. 1A, according to another example. As shown, the memristor 100 depicted in FIG. 1D includes all of the features of the memristor 100 depicted in FIG. 1A, except that the nanostructures 112 comprise a nanowire 130. As discussed above with respect to the nanostructures 112, the nanowire 130 is in electrical contact with the first electrode 102 and may comprise any of the materials discussed above with respect to the nanostructures 112. In addition, the nanowire 130 may have a substantially conical shape, such that, a top section of the nanowire 130 forms a tip.

According to an embodiment, the nanowire 130 may be placed or grown on the first surface 114 of the first electrode 102 prior to placement or growth of the switching material 108. In addition, the nanowire 130 may be placed or grown in a recess on the first surface 114. In any regard, the nanowire 130 is configured to have a relatively small size such that it induces a very small conductance channel during electroforming. The subsequent switching occurs within this small conductance channel and therefore the switching and reading operation currents are relatively low. By way of particular example, the nanowire 130 may have a diameter and a height of between about 3-50 nanometers. As another particular example, the nanowire 130 may have a diameter and a height of between about 3-10 nanometers.

Turning now to FIG. 1E, there is shown a cross-sectional side view of the memristor 100 depicted in FIG. 1A, according to another example. As shown, the memristor 100 depicted in FIG. 1E includes all of the features of the memristor 100 depicted in FIG. 1D. In addition, the memristor 100 depicted in FIG. 1E also includes an additional nanowire 132 provided in contact with a bottom surface 122 of the second electrode 104. As with the nanowire 130, the nanowire 132 is in electrical contact with the second electrode 104 and may comprise any of the materials discussed above with respect to the nanostructures 112.

According to an embodiment, the nanowire 132 may be grown on or attached to the bottom surface 122 of the second electrode 104 prior to placement of the second electrode 104 on the switching material 108. In any regard, the nanowire 132 may have the same or similar configuration as the nanowire 130. As such, the nanowire 132 is configured to have a relatively small size such that a very small switching conductance channel is created between the tip of the nanowire 132 and the tip of the nanowire 130.

Although FIGS. 1D and 1E depict single nanowires 130 and 132 having tips, it should be understood that multiple nanowires 130 and/or 132 may be provided without departing from a scope of the memristor 100. In addition or alternatively, either or both of the nanowires 130 and 132 may be fabricated to have a plurality of tips or a relatively flat surface, without departing from a scope of the memristor 100.

Figure 2:
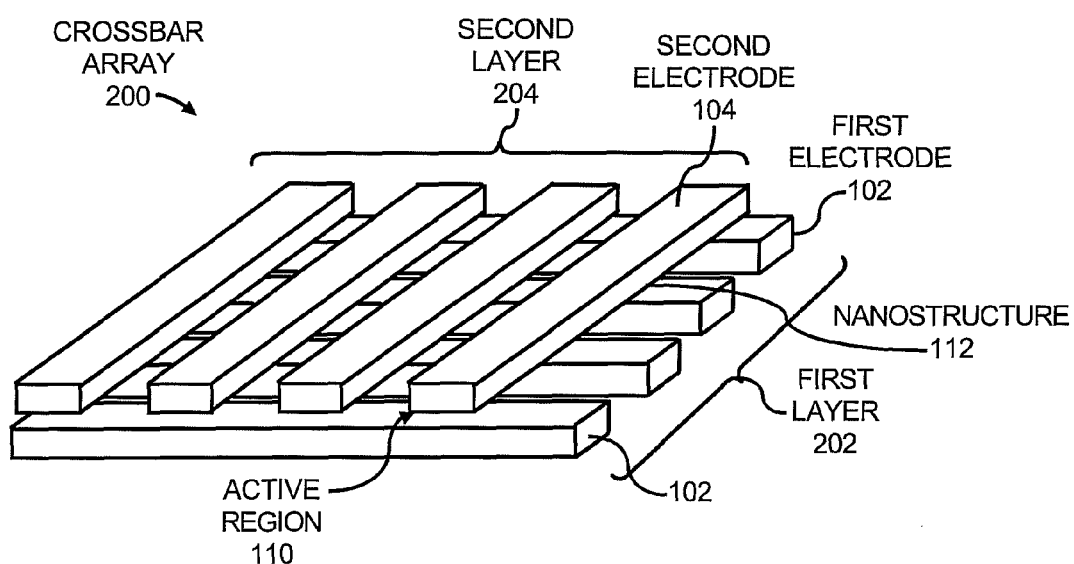
FIG. 2 illustrates a crossbar array employing a plurality of the memristors depicted in any of FIGS. 1A-1E, according to an embodiment of the invention.

With reference now to FIG. 2, there is shown a crossbar array 200 employing a plurality of the memristors 100 shown in any of FIGS. 1A-1E, according to an embodiment. It should be understood that the crossbar array 200 depicted in FIG. 2 may include additional components and that some of the components described herein may be removed and/or modified without departing from a scope of the crossbar array 200.

As shown in FIG. 2, a first layer 202 of approximately parallel first electrodes 102 is overlain by a second layer 204 of approximately parallel second electrodes 104. The second layer 204 is roughly perpendicular, in orientation, to the first electrodes 102 of the first layer 202, although the orientation angle between the layers may vary. The two layers 202, 204 form a lattice, or crossbar, with each second electrode 104 of the second layer 204 overlying all of the first electrodes 102 of the first layer 202 and coming into close contact with each first electrode 102 of the first layer 202 at respective junctions 106, which represent the closest contact between two of the first and second electrodes 102 and 104. The crossbar array 200 depicted in FIG. 2 may be fabricated from micron-, submicron or nanoscale-electrodes 102, 104, depending on the application.

Although the first electrodes 102 and second electrodes 104 depicted in FIGS. 1A-1E and 2 are shown with rectangular cross-sections, the first electrodes 102 and/or the second electrodes 104 may have circular, elliptical, or more complex cross-sections. The first electrodes 102 and/or the second electrodes 104 may also have many different widths or diameters and aspect ratios or eccentricities. The term "nanowire crossbar" may refer to crossbars having one or more layers of sub-microscale electrodes, microscale electrodes or electrodes with larger dimensions, in addition to nanowires.

Figure 3:
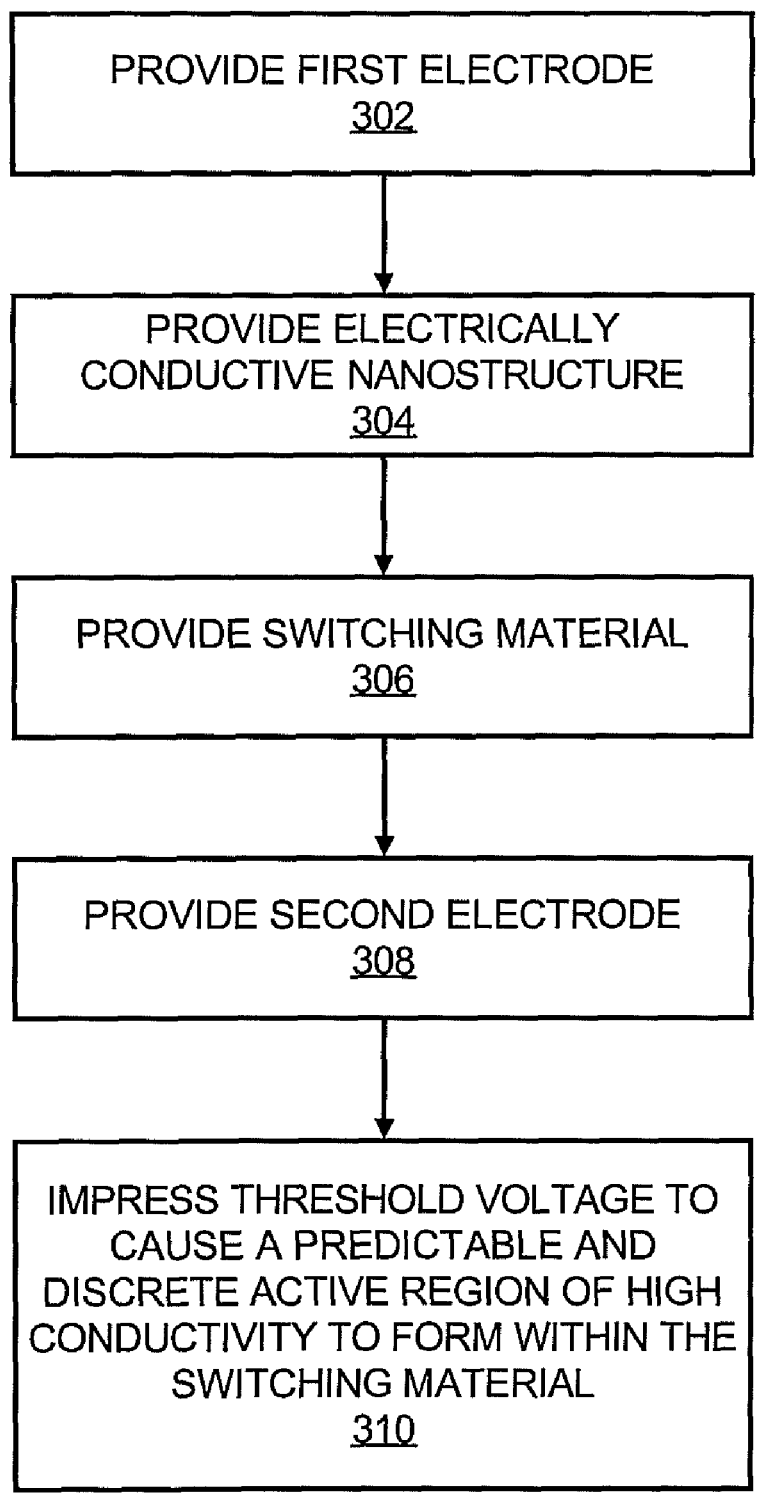
FIG. 3 illustrates a flow diagram of a method for performing a forming process in order to initiate switching behavior in a memristor, according to an embodiment of the invention.

Turning now to FIG. 3, there is shown a flow diagram of a method 300 for performing a forming process in order to initiate switching behavior in a memristor 100, according to an embodiment. It should be understood that the method 300 depicted in FIG. 3 may include additional steps and that some of the steps described herein may be removed and/or modified without departing from a scope of the method 300.

At step 302, a first electrode 102 having a first surface 114 is provided. The first electrode 102 may be provided through a formation process, such as, chemical vapor deposition, sputtering, etching, lithography, etc. At step 304, at least one electrically conductive nanostructure 112 is provided on the first surface 114 of the first electrode 102. As discussed above, the at least one electrically conductive nanostructure 112 may be provided on the first surface 114 through placement or growth of individual nanostructures 112 on the first surface 114 or in a recess provided in the first surface 114. In addition, the at least one electrically conductive nanostructure 112 may comprise one or more nanowires 130.

At step 306, a switching material 108 is provided upon the first surface 114, such that the switching material 108 covers the at least one electrically conductive nanostructure 112. According to an example, the switching material 108 is grown on the first surface 114 to cover the at least one electrically conductive nanostructure 112. The switching material 108 may be grown through use of, for instance, metal-catalyzed growth from vapor, liquid, or solid-phase precursors, growth from a chemical solution, or rapid deposition of material vaporized from a solid source. In addition, at step 306, a top surface of the switching material 108 may be planarized, for instance, by chemical-mechanical polishing to create a relative smooth surface. Moreover, for instance, as depicted in FIGS. 1C and 1E, the top surface of the switching material 108 may be processed to receive the at least one electrically conductive nanostructure 120 or nanowire 132.

At step 308, a second electrode 104 is formed on the switching material 108. Although not shown, additional steps for providing at least one electrically conductive nanostructure 120 and/or nanowire 132 on the bottom surface 122 of the second electrode 104 may also be included in the method 300.

At step 310, a threshold voltage is impressed through the at least one electrically conductive nanostructure 112, the switching material 108 substantially adjacent to the at least one electrically conductive nanostructure 112, and through the second electrode 104 for a sufficient length of time to cause a predictable and discrete active region of high conductivity to form within the switching material 108 substantially adjacent to the at least one electrically conductive nanostructure 112. In instances where the memristor 100 also includes the at least one electrically conductive nanostructure 120 and/or nanowire 130 provided in contact with the bottom surface 122 of the second electrode 104, the threshold voltage is also impressed through the at least one electrically conductive nanostructure 120 and/or nanowire 130. It should be understood that in some cases, due to the local electrical field enhancement by these nanostructures inside a thin (e.g., >10 nm) switching material, the electroforming voltage may be within the same range of the normal switching voltage and the device may be called an electroforming free memristor. Electroforming free devices are very desirable in various applications.

It should be understood that the memristors 100 depicted in the figures discussed above may be modified in various respects without departing from a scope of those disclosed memristors 100. By way of example, the switching material 108 may be composed of a dual layer structure as described in greater detail in the 20080090337 U.S. Patent Application Publication. As disclosed therein, the dual layer structure of the switching material enhances the switching properties and operation of devices using electrically actuated switches constructed therewith. That application for patent also describes a wide combination of materials than can be used to facilitate the switching process using the dual layer structure.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A memristor comprising:
a first electrode having a first surface;
a cluster of electrically conductive nanostructures, wherein the cluster of electrically conductive nanostructures is provided in contact with the first surface, and wherein the cluster of electrically conductive nanostructure is relatively smaller than a width of the first electrode, wherein the electrically conductive nanostructures comprise a plurality of nano-particles that are stacked on top of each other;
a switching material positioned upon said first surface, wherein the switching material covers the cluster of electrically conductive nanostructures; and
a second electrode positioned upon said switching material substantially in line with the cluster of electrically conductive nanostructures, wherein an active region in the switching material is formed substantially between the cluster of electrically conductive nanostructures and the second electrode.

2. The memristor of claim 1, wherein the first surface comprises at least one recess, and wherein the cluster of electrically conductive nanostructures is placed in the at least one recess.

3. The memristor of claim 1, further comprising:
a second cluster of electrically conductive nanostructures positioned in the switching material between the cluster of electrically conductive nanostructures and the second electrode, wherein the second cluster of electrically conductive nanostructures is in contact with a surface of the second electrode.

4. The memristor of claim 1, further comprising:
a second electrically conductive nanostructure placed in the switching material between the cluster of electrically conductive nanostructures and the second electrode, wherein the second electrically conductive nanostructure is relatively smaller than a width of the second electrode.

5. The memristor of claim 4, wherein the second electrically conductive nanostructure is positioned substantially in line with the cluster of electrically conductive nanostructures.

6. The memristor of claim 1, wherein each of the plurality of electrically conductive nanostructures comprises a colloidal metal.

7. The memristor of claim 1, wherein the switching material comprises a metal oxide.

8. The memristor of claim 1, wherein each of the plurality of electrically conductive nanostructures has at least one dimension that is between about 1-10 nanometers.

9. A crossbar array composed of a plurality of memristors, said crossbar array comprising:
a plurality of first electrodes positioned approximately parallel with respect to each other, each of said plurality of first electrodes having respective first surfaces;
a plurality of clusters of electrically conductive nanostructures placed in contact with the first surfaces of the plurality of first electrodes, wherein each of the plurality of clusters of electrically conductive nanostructures is relatively smaller than widths of the plurality of first electrodes, wherein the electrically conductive nanostructures comprise nano-particles that are stacked on top of each other;
a switching material positioned upon said first surfaces, wherein the switching material covers the plurality of clusters of electrically conductive nanostructures; and
a plurality of second electrodes positioned approximately parallel with respect to each other and approximately perpendicularly with respect to the plurality of first electrodes, such that junctions are formed between the first electrodes and the second electrodes substantially at the locations of the clusters of the plurality of electrically conductive nanostructures, wherein the switching material is positioned upon the plurality of first electrodes, and wherein active regions in the switching material are formed at the junctions.

10. The crossbar array of claim 9, wherein the first surfaces each comprises at least one recess, and wherein the clusters of electrically conductive nanostructures are placed in respective ones of the at least one recess.

11. The crossbar array of claim 9, further comprising:
a plurality of second clusters of electrically conductive nanostructures positioned in the switching material between respective clusters of electrically conductive nanostructures and the second electrodes, wherein the second clusters of electrically conductive nanostructures are in contact with respective surfaces of the second electrodes.

12. The crossbar array of claim 9, said crossbar array further comprising:
a plurality of other electrically conductive nanostructures placed in the switching material between respective clusters of electrically conductive nanostructures and the plurality of second electrodes, wherein each of the plurality of other electrically conductive nanostructures is relatively smaller than widths of the plurality of second electrodes.

13. The crossbar array of claim 9, wherein each of the plurality of second electrodes is spaced from the plurality of first electrodes such that respective active regions in the switching material located between the electrically conductive nanostructures and the second electrodes form at the junctions.

14. The crossbar array of claim 9, wherein each of the electrically conductive nanostructures comprises a colloidal metal.

15. The crossbar array of claim 9, wherein each of the electrically conductive nanostructures includes at least one dimension that is between about 1-10 nanometers.

16. A method for performing a forming process in order to initiate switching behavior in a memristor, said method comprising:
providing a first electrode having a first surface;
providing a cluster of electrically conductive nanostructures in contact with the first surface, wherein the cluster of electrically conductive nanostructures is relatively smaller than a width of the first electrode, wherein providing the cluster of electrically conductive nanostructures further comprises stacking a plurality of nano-particles on top of each other to form the cluster of electrically conductive nanostructures;
providing a switching material upon said first surface, wherein the switching material covers the cluster of electrically conductive nanostructures;
providing a second electrode upon said switching material substantially in line with the cluster of electrically conductive nanostructures; and
impressing a threshold voltage through the cluster of electrically conductive nanostructures, the switching material substantially adjacent to the at least one cluster of electrically conductive nanostructures, and through the second electrode for a sufficient length of time to cause a predictable and discrete active region of high conductivity to form within the switching material substantially adjacent to the cluster of electrically conductive nanostructures.

17. The method according to claim 16, wherein providing the cluster of electrically conductive nanostructures further comprises growing a plurality of the electrically conductive nanostructures on the first surface to form the cluster of electrically conductive nanostructures.

* * * * *